(12) United States Patent
Yang et al.

(10) Patent No.: US 12,272,679 B2
(45) Date of Patent: Apr. 8, 2025

(54) DISPLAY PANEL AND MANUFACTURING METHOD THEREOF

(71) Applicant: PlayNitride Display Co., Ltd., MiaoLi County (TW)

(72) Inventors: Shiang-Ning Yang, MiaoLi County (TW); Sheng-Yuan Sun, MiaoLi County (TW); Loganathan Murugan, MiaoLi County (TW); Yu-Yun Lo, MiaoLi County (TW); Bo-Wei Wu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 572 days.

(21) Appl. No.: 17/569,532

(22) Filed: Jan. 6, 2022

(65) Prior Publication Data

US 2023/0154901 A1 May 18, 2023

(30) Foreign Application Priority Data

Nov. 16, 2021 (TW) ................................. 110142500

(51) Int. Cl.
 *H01L 25/07* (2006.01)
 *H01L 25/075* (2006.01)
 (Continued)

(52) U.S. Cl.
 CPC ...... *H01L 25/0753* (2013.01); *H01L 33/0093* (2020.05); *H01L 33/54* (2013.01);
 (Continued)

(58) Field of Classification Search
 CPC . H01L 25/0753; H01L 33/0093; H01L 33/54; H01L 33/58; H01L 33/62;
 (Continued)

(56) References Cited

U.S. PATENT DOCUMENTS

2017/0256694 A1* 9/2017 Lim .................... H01L 33/0093
2018/0226543 A1* 8/2018 Masui .................... H01L 33/46
(Continued)

FOREIGN PATENT DOCUMENTS

CN 109643745 4/2019
CN 112462545 3/2021
(Continued)

OTHER PUBLICATIONS

"Office Action of Taiwan Counterpart Application", issued on Jul. 21, 2022, p. 1-p. 6.
(Continued)

*Primary Examiner* — S M Sohel Imtiaz
(74) *Attorney, Agent, or Firm* — JCIPRNET

(57) ABSTRACT

A display panel and a manufacturing method thereof are provided. The display panel includes a circuit substrate and a plurality of micro light-emitting diode structures. The micro light-emitting diode structures each include a micro light-emitting chip and a molding structure. The micro light-emitting chip is electrically bonded to the circuit substrate, and includes a first surface, a second surface, and a peripheral surface. The first surface is located on a side of the micro light-emitting chip facing the circuit substrate. The second surface is disposed opposite to the first surface. The peripheral surface connects the first surface and the second surface. The molding structure surrounds the peripheral surface and encloses the second surface of the micro light-emitting chip. The molding structure extends in a direction away from the circuit substrate and forms an inner side wall. The inner side wall and the second surface constitute an accommodating portion.

12 Claims, 7 Drawing Sheets

(51) Int. Cl.
   *H01L 33/00*    (2010.01)
   *H01L 33/54*    (2010.01)
   *H01L 33/58*    (2010.01)
   *H01L 33/62*    (2010.01)

(52) U.S. Cl.
   CPC .............. *H01L 33/58* (2013.01); *H01L 33/62* (2013.01); *H01L 2933/005* (2013.01); *H01L 2933/0066* (2013.01)

(58) Field of Classification Search
   CPC ....... H01L 2933/005; H01L 2933/0066; H01L 33/0095
   See application file for complete search history.

(56) References Cited

U.S. PATENT DOCUMENTS

| | | | |
|---|---|---|---|
| 2021/0036187 A1* | 2/2021 | Lee | H01L 33/0066 |
| 2021/0376209 A1* | 12/2021 | Wang | H01L 25/0753 |
| 2023/0006095 A1* | 1/2023 | Park | H01L 33/20 |
| 2023/0015395 A1* | 1/2023 | Lee | H01L 25/0753 |

FOREIGN PATENT DOCUMENTS

| | | |
|---|---|---|
| CN | 112582441 | 3/2021 |
| TW | 201733106 | 9/2017 |

OTHER PUBLICATIONS

"Office Action of China Counterpart Application", issued on Sep. 7, 2024, p. 1-p. 7.

* cited by examiner

DISPLAY PANEL AND MANUFACTURING METHOD THEREOF

CROSS-REFERENCE TO RELATED APPLICATION

This application claims the priority benefit of Taiwanese application no. 110142500, filed on Nov. 16, 2021. The entirety of the above-mentioned patent application is hereby incorporated by reference herein and made a part of this specification.

BACKGROUND

Technical Field

The disclosure relates to a display panel and a manufacturing method thereof. Particularly, the disclosure relates to a display panel and a manufacturing method thereof in which light directivity or light transmittance can be improved.

Description of Related Art

At present, during a process of manufacturing a micro light-emitting diode (micro LED) display panel, after a micro light-emitting diode is transferred to a circuit substrate, a light-shielding layer (e.g., a black matrix) may be separately manufactured, covering the circuit substrate and shielding a gap between each sub-pixel, to thus prevent crosstalk between lights emitted by the sub-pixels. However, since the light-shielding layer is manufactured on a panel, it is required to pay particular attention to high temperature and circuit protection, thus making the process relatively difficult. In addition, the separately manufactured light-shielding layer completely covers the gaps between the sub-pixels, leading to relatively poor transparency of the display panel.

Based on the requirements of display screens, in the light-shielding layer, a patterned transparent region is required to be manufactured corresponding to a light-emitting region of the sub-pixel. However, since the light-shielding layer is a non-transparent material, when the light-shielding layer has a relatively great thickness, it may cause an unsmooth exposure of the bottom of the light-shielding layer in a photolithography process, and cause the thickness of the light-shielding layer to be limited by the manufacturing process.

SUMMARY

The disclosure provides a display panel and a manufacturing method thereof, in which light directivity can be improved, light transmittance (or transparency) of the display panel can be improved, a product yield can be increased, or an amount of costs can be saved.

A display panel of the disclosure includes a circuit substrate and a plurality of micro light-emitting diode structures. The micro light-emitting diode structures each include a micro light-emitting chip and a molding structure. The micro light-emitting chip is electrically bonded to the circuit substrate. The micro light-emitting chip includes a first surface, a second surface, and a peripheral surface. The first surface is located on a side of the micro light-emitting chip facing the circuit substrate. The second surface is disposed opposite to the first surface. The peripheral surface connects the first surface and the second surface. The molding structure surrounds the peripheral surface and encloses the second surface of the micro light-emitting chip. The molding structure extends in a direction away from the circuit substrate and forms an inner side wall. The inner side wall and the second surface constitute an accommodating portion.

In an embodiment of the disclosure, the molding structure extends from the peripheral surface to the first surface of the micro light-emitting chip.

In an embodiment of the disclosure, each of the micro light-emitting chip further includes at least one electrode. The at least on electrode is disposed on the first surface and exposed from the molding structure, and is electrically connected to the circuit substrate.

In an embodiment of the disclosure, there is a gap between the molding structure and the circuit substrate.

In an embodiment of the disclosure, the second surface of each of the micro light-emitting chip is divided into a central part and a peripheral part. The peripheral part is covered by the molding structure. A ratio of an area of the central part to an area of the second surface is greater than or equal to 0.7.

In an embodiment of the disclosure, there is an included angle between the inner side wall and the second surface. The included angle is between 90 degrees and 150 degrees.

In an embodiment of the disclosure, the molding structure has an end portion. A distance between the end portion and the second surface is between 3 micrometers and 10 micrometers.

In an embodiment of the disclosure, the molding structure has an end portion. A cross-sectional area of the accommodating portion gradually increases from the second surface toward the end portion.

In an embodiment of the disclosure, the circuit substrate has an exposed region. The exposed region is located between orthogonal projections of any adjacent two of the micro light-emitting diode structures on the circuit substrate. The exposed region is not overlapped with orthogonal projections of the molding structures on the circuit substrate.

In an embodiment of the disclosure, the molding structure includes a non-transparent material.

In an embodiment of the disclosure, each of the micro light-emitting diode structures further includes a light guide layer. The light guide layer is disposed on the second surface.

A manufacturing method of a display panel of the disclosure includes the following. A carrier substrate is provided. A plurality of connecting layers are formed on the carrier substrate. A plurality of micro light-emitting chips are provided. Each of the micro light-emitting chips has a first surface, a second surface opposite to the first surface, and a peripheral surface connecting the first surface and the second surface. The carrier substrate is operated, and the connecting layers are bonded to the corresponding second surfaces, such that the first surface is located on a side of the micro light-emitting chip away from the carrier substrate. A molding structure is formed on each of the micro light-emitting chips, such that each of the molding structures extends along a side wall of each of the connecting layers to the peripheral surface and the first surface of each of the micro light-emitting chips. A circuit substrate is provided. The carrier substrate is operated, and each of the micro light-emitting chips is bonded to the circuit substrate. At least a part of each of the connecting layers is removed to separate the micro light-emitting chips from the carrier substrate. Each of the molding structures encloses the second surface of each of the micro light-emitting chips, and constitutes an accommodating portion together with the second surface.

In an embodiment of the disclosure, the step of forming the connecting layers on the carrier substrate further includes the following. The connecting layers are connected to each other to form a protection layer on the carrier substrate. The protection layer is located between the molding structures and the carrier substrate.

In an embodiment of the disclosure, the molding structures cover the first surface. The manufacturing method further includes the following. A part of the molding structure on the first surface is removed to expose at least one electrode of each of the micro light-emitting chips.

In an embodiment of the disclosure, the manufacturing method further includes the following. Patterning is performed to remove a part of the molding structure according to an exposure pattern. An orthogonal projection of the exposure pattern on the carrier substrate is not overlapped with orthogonal projections of micro light-emitting diode structures on the carrier substrate.

In an embodiment of the disclosure, in the step of forming the connecting layers on the carrier substrate, the connecting layers are in a shape of a rectangular cuboid, a truncated cone, or a square frustum.

In an embodiment of the disclosure, in the step of forming the connecting layers on the carrier substrate, a cross-sectional area of the connecting layers gradually decreases in a direction away from the carrier substrate.

In an embodiment of the disclosure, the removing each of the connecting layers further includes the following. A part of the connecting layers is retained on the second surface.

Based on the foregoing, in the display panel and the manufacturing method thereof according to the embodiments of the disclosure, since the molding structure may extend on the peripheral surface and the first surface of the micro light-emitting chip, crosstalk between lights emitted by two adjacent micro light-emitting chips can be prevented, and light directivity can be improved. Furthermore, compared to general steps of manufacturing in which a relatively thick molding structure cannot be manufactured because of limitations of a photolithography process, in the manufacturing method of a display panel of the embodiments of the disclosure, a relatively thick molding structure can be easily adjusted or manufactured as required by changing the height of the connecting layer. In addition, since the forming the molding structure may be performed on the carrier substrate (temporary substrate), it is not required to perform complicated and relatively difficult processes such as high temperature and circuit protection processes on the circuit substrate in the subsequent manufacturing process, thus greatly improving the product yield.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIG. 1A to FIG. 1F are schematic cross-sectional views of a manufacturing method of a display panel according to an embodiment of the disclosure. A manufacturing method of a display panel 100 of this embodiment includes the following.

Figure 1A:
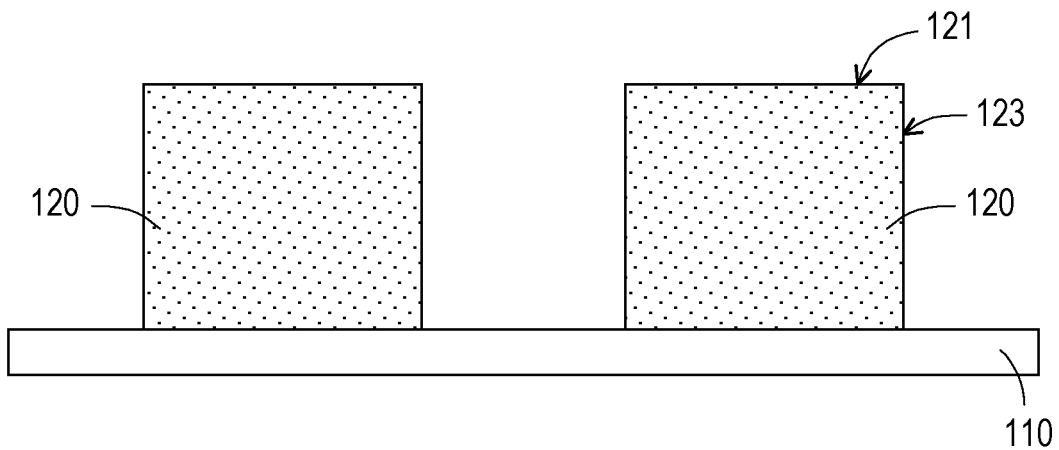
FIG. 1A to FIG. 1F are schematic cross-sectional views of a manufacturing method of a display panel according to an embodiment of the disclosure.

With reference to FIG. 1A, first, a carrier substrate 110 is provided. The carrier substrate 110 is, for example but not limited to, a temporary substrate such as a plastic substrate, a glass substrate, or a substrate.

Figure 4A:
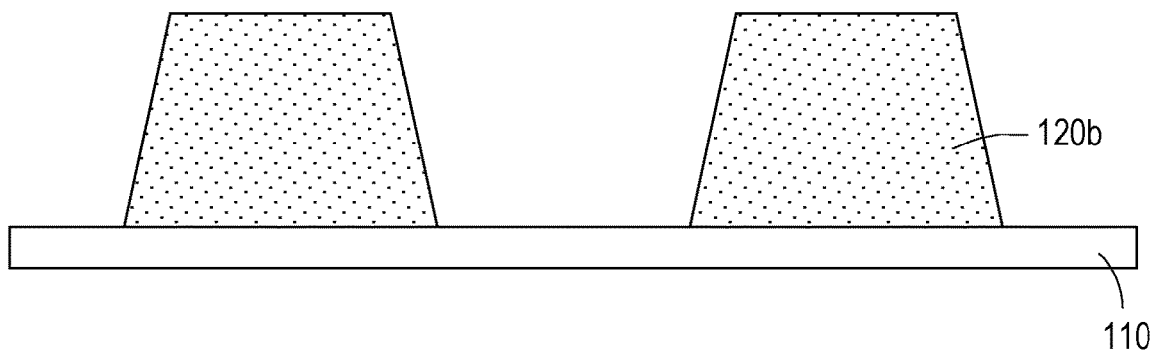
FIG. 4A to FIG. 4B are schematic cross-sectional views of a manufacturing method of a display panel according to another embodiment of the disclosure.
Figure 4B:
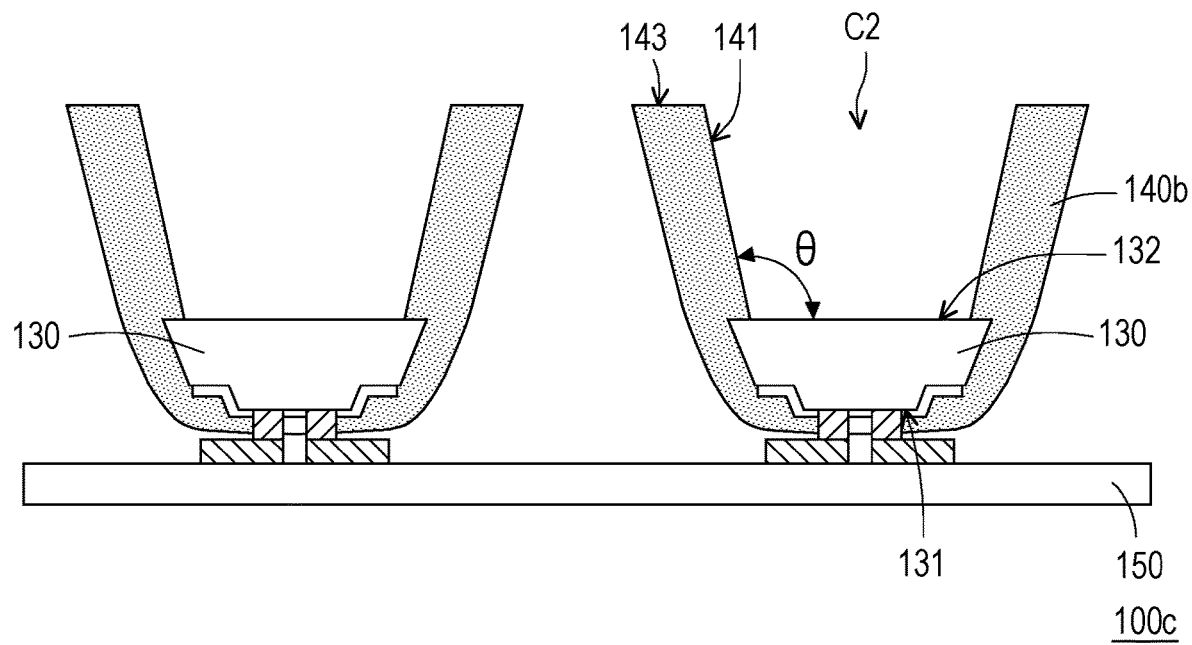

Next, a plurality of connecting layers 120 are formed on the carrier substrate 110. Each of the connecting layers 120 has an upper surface 121 and a side wall 123 connected to the upper surface 121. In this embodiment, the material of the connecting layer 120 may be a transparent material. The material of the connecting layer 120 may be, for example but not limited to, polydimethylsiloxane (PDMS) or a SU-8 polymer. In this embodiment, the connecting layer 120 is substantially in a shape of a rectangular cuboid, but not limited thereto. In some embodiments, the connecting layer 120 may also be in a shape of a truncated cone (not shown) or a square frustum (as shown in FIG. 4A and FIG. 4B).

Figure 1B:
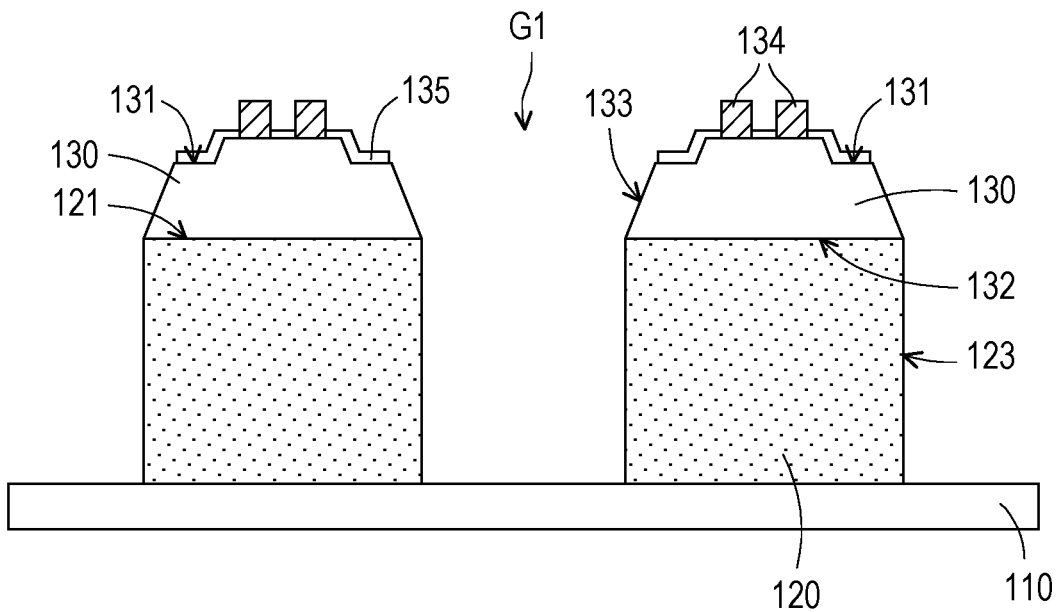

Then, with reference to FIG. 1B, a plurality of micro light-emitting chips 130 are provided. The micro light-emitting chips 130 are, for example but not limited to, a micro LED (mLED/μLED) or an organic light-emitting diode (OLED). Each of the micro light-emitting chips 130 has a first surface 131, a second surface 132 opposite to the first surface 131, and a peripheral surface 133 connecting the first surface 131 and the second surface 132. Each of the micro light-emitting chips 130 includes at least one electrode 134 (two electrodes being schematically shown in FIG. 1B as an example) and an isolating layer 135. The isolating layer 135 is disposed on the first surface 131 of the micro light-emitting chip 130, and exposes part of the first surface 131. The electrode 134 is disposed on the first surface 131 of the micro light-emitting chip 130, and disposed on the part of the first surface 131 exposed by the isolating layer 135.

Next, the micro light-emitting chips 130 are respectively bonded to the connecting layers 120. Additionally, although in FIG. 1B, the second surface 132 of the micro light-emitting chip 130 and the upper surface 121 of the connecting layer 120 have the same width (or area), in other embodiments (in FIG. 3, for example), the second surface 132 and the upper surface 121 may have different dimensions.

Normal side pressing may be adopted for the above-mentioned bonding process. For example, the micro light-emitting chips 130 are fixed on another substrate, and pressed to the connecting layers 120 on the carrier substrate 110. Alternatively, it is also possible to operate the carrier substrate 110, and bond the upper surfaces 121 of the connecting layers 120 to the second surfaces 132 of the corresponding micro light-emitting chips 130, but the disclosure is not limited thereto. At this time, the first surface 131 of the micro light-emitting chip 130 is located on a side of the micro light-emitting chip 130 away from the carrier substrate 110.

Figure 1C:
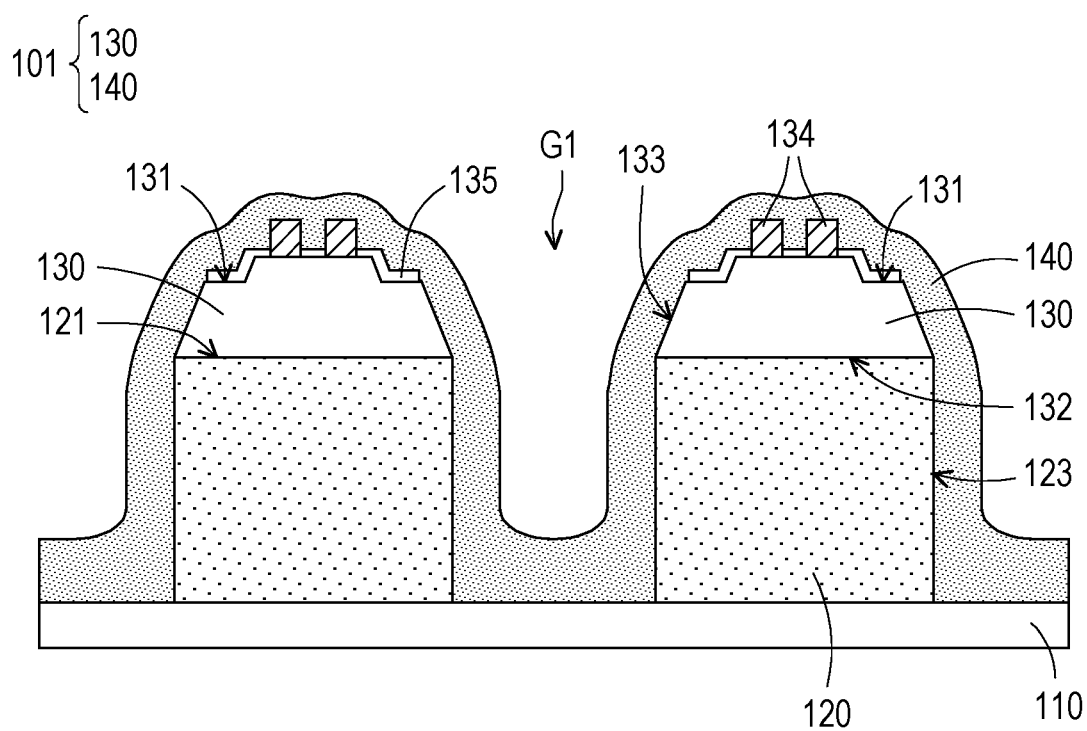

As shown in FIG. 1C, next, a molding structure 140 is formed on each of the micro light-emitting chips 130, so that the molding structure 140 may extend along the side wall 123 of each connecting layer 120 to the peripheral surface 133 and the first surface 131 of each micro light-emitting chip 130.

In this embodiment, the molding structure 140 may be formed by, for example but not limited to, coating. In this embodiment, the material of the molding structure 140 may be a non-transparent material or a light-shielding material, to reduce crosstalk between lights emitted by two adjacent micro light-emitting chips (i.e., the micro light-emitting chips 130), and improve light directivity. The material of the molding structure 140 may be, for example but not limited to, a black photoresist (for example, containing carbon black), a white photoresist (for example, containing titanium dioxide), or a gray photoresist (for example, containing carbon black and titanium dioxide in certain proportions). When the molding structure 140 has a relatively dark color, the molding structure 140 has a relatively strong light absorption and a relatively high contrast; on the contrary, when the molding structure 140 has a relatively light color, the molding structure 140 is relatively likely to emit light by reflection and has a relatively high brightness. In some embodiments, the material of the molding structure 140 may also be, for example but not limited to, resin, epoxy, polymethyl methacrylate (PMMA), polysiloxane, or polyimide (PI). In some embodiments, the material of the molding structure 140 may also be filled with metal particles to form a mixture to enhance reflection.

Figure 1D:
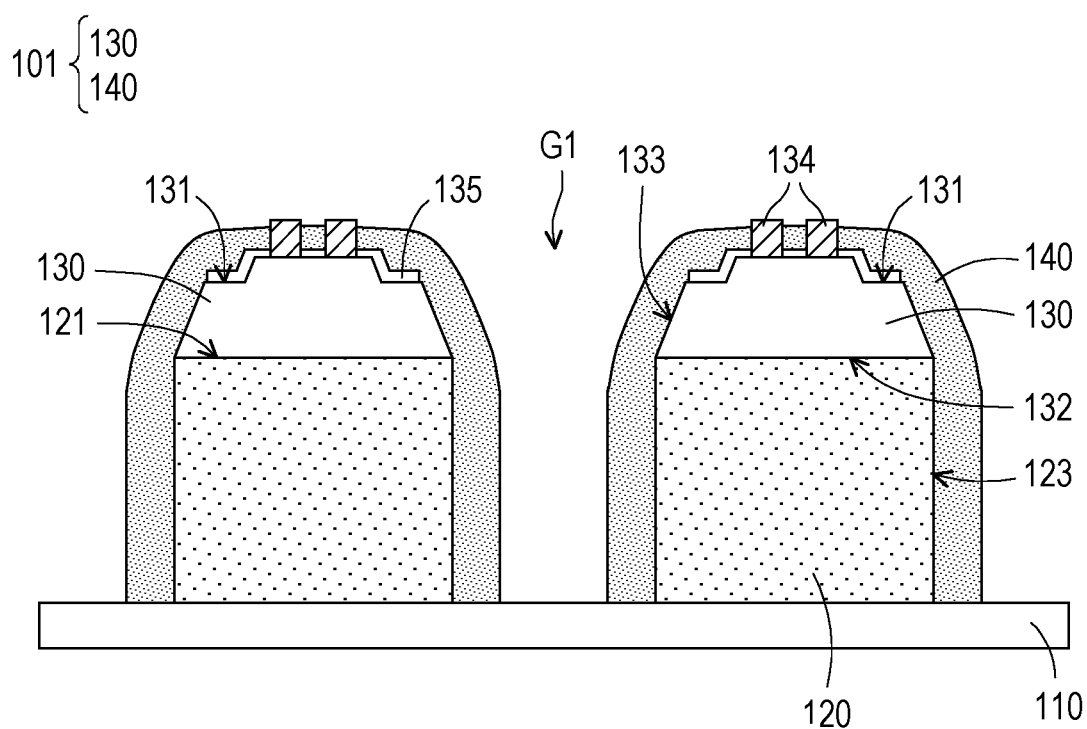

As shown in FIG. 1D, a part of the molding structure 140 on the first surface 131 of the micro light-emitting chip 130 is removed to expose the electrode 134 of each micro light-emitting chip 130. In the meantime, the material at the junction between two adjacent molding structures 140 is also removed to form a gap G1. Here, the molding structure 140 is formed on each of the micro light-emitting chips 130 and covers the same. In addition, the molding structure 140 and the micro light-emitting chip 130 constitute a micro light-emitting diode structure 101. In this embodiment, the part of the molding structure 140 may be removed by, for example but not limited to, photolithography. At this time, the electrode 134 of each micro light-emitting chip 130 may be exposed from the molding structure 140.

Figure 1E:
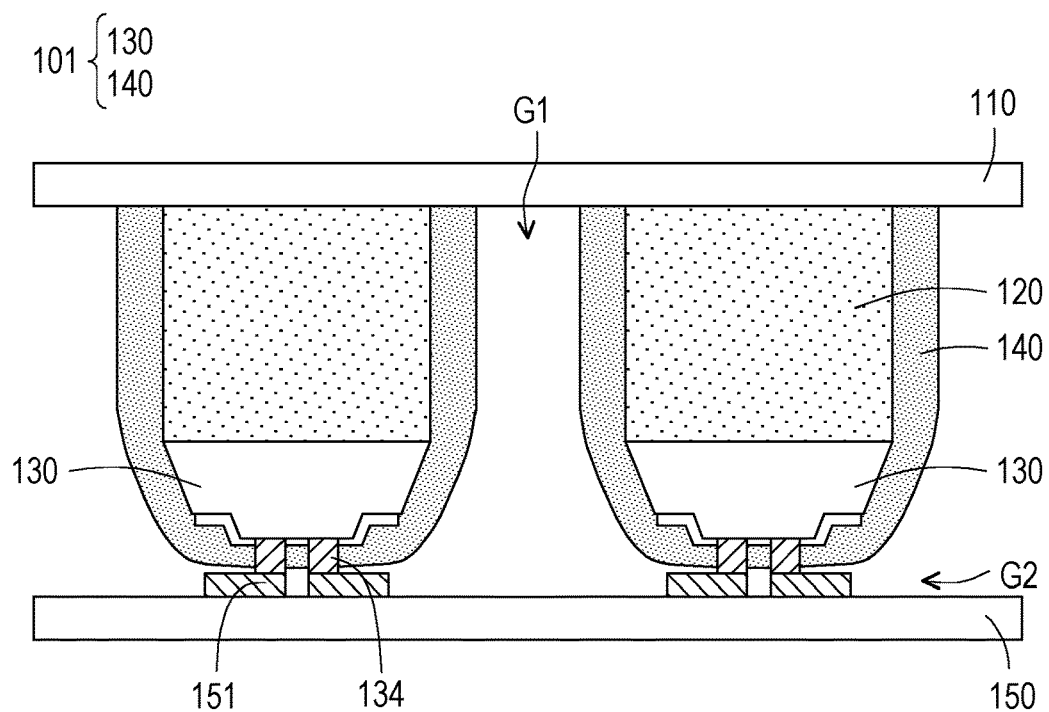

With reference to FIG. 1E, after the above are completed, a circuit substrate 150 is provided. The circuit substrate 150 includes a plurality of pads 151 and a driving circuit (not shown), and the driving circuit may be electrically connected to the pads 151.

Next, transferring the micro light-emitting chip 130 is performed: the carrier substrate 110 is operated, and the electrode 134 of each micro light-emitting chip 130 is bonded to the circuit substrate 150 through the pads 151. At this time, the electrodes 134 of each micro light-emitting chip 130 may be in contact with the pads 151 and be electrically connected to the circuit substrate 150 through the pads 151. In this embodiment, there is a gap G2 between the molding structure 140 and the circuit substrate 150.

Figure 1F:
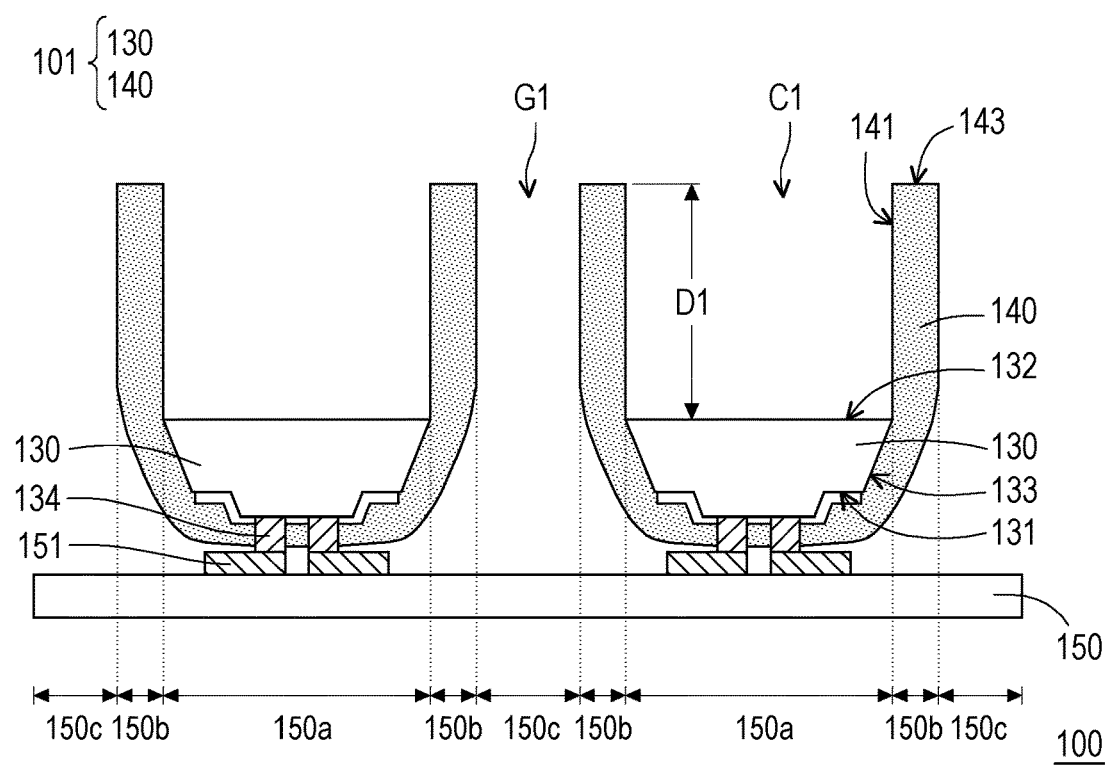

Then, with reference to FIG. 1F, the material at the junction between at least a part of each connecting layer 120 and the carrier substrate 110 may be removed to separate the micro light-emitting chips 130 from the carrier substrate 110. Further, the remaining connecting layer 120 is removed to expose the second surface 132 of each micro light-emitting chip 130 and an inner side wall 141 of the molding structure 140. In this embodiment, the connecting layer 120 may be removed by, for example but not limited to, laser lift-off (LLO), isotropic etching, or anisotropic etching. At this time, the molding structure 140 encloses the second surface 132 of each micro light-emitting chip 130, and the molding structure 140 extends in a direction away from the circuit substrate 150. The inner side wall 141 of the molding structure 140 and the second surface 132 may form an accommodating portion C1. In this embodiment, the accommodating portion C1 may be an air cavity for color conversion materials (e.g., quantum dots) and/or micro lenses to be filled therein in the subsequent manufacturing process, but not limited thereto.

In this embodiment, since the molding structure 140 may extend on the side wall 123 of the connecting layer 120, the peripheral surface 133 of the micro light-emitting chip 130, and the first surface 131 of the micro light-emitting chip 130, crosstalk between lights emitted by two adjacent micro light-emitting chips 130 can be prevented, and light emission directivity (e.g., light emission in a direction away from the first surface 131) can be improved.

In this embodiment, the molding structure 140 has an end portion 143. In the normal direction of the circuit substrate 150, there is a distance D1 between the end portion 143 and the second surface 132 of the micro light-emitting chip 130, and the distance D1 may be regarded as the depth of the accommodating portion C1. From the above description, it follows that since the distance D1 is determined by the height of the connecting layer 120, that is, the molding structure 140 is not formed by a photolithography process; therefore, by changing the height of the connecting layer 120, the distance D1 and/or the thickness of the molding structure 140 can be easily adjusted. Therefore, compared to general steps of manufacturing in which a relatively thick molding structure (i.e., a relatively deep accommodating portion) cannot be manufactured because of limitations of the photolithography process, the manufacturing method of the display panel 100 of this embodiment may not be limited by the process, meeting the requirements of different products. In this embodiment, the distance D1 may be, for example but not limited to, between 3 micrometers (μm) and 10 micrometers.

In this embodiment, the circuit substrate 150 may have a first region 150a, a second region 150b, and an exposed region 150c. In the normal direction of the circuit substrate 150, an orthogonal projection of the micro light-emitting chip 130 on the circuit substrate 150 may be substantially overlapped with the first region 150a. An orthogonal projection of a part of the molding structure 140 on the circuit substrate 150 may be substantially overlapped with the second region 150b. The exposed region 150c is located between orthogonal projections of any two adjacent micro light-emitting diode structures 101 on the circuit substrate 150. In addition, the exposed region 150c is not overlapped with the orthogonal projection of the micro light-emitting chip 130 on the circuit substrate 150, and is not overlapped with the orthogonal projection of the molding structure 140 on the circuit substrate 150. In this embodiment, since the exposed region 150c of the circuit substrate 150 is not covered by the molding structure 140, with the exposed region 150c, the light transmittance of the display panel 100

(e.g., the circuit substrate 150 with transparency) of this embodiment can be improved.

It should be noted that, compared to a general display panel where a molding structure is produced only after micro light-emitting chips are transferred to a circuit substrate, in the manufacturing method of the display panel 100 of this embodiment, since the molding structure 140 may already be formed on the carrier substrate 110 (temporary substrate), it is not required to perform high temperature or other complicated and relatively difficult processes on the circuit substrate 150 in the subsequent manufacturing process, thus greatly improving the product yield, while omitting part of circuit protection.

In addition, since adhering the micro light-emitting chip 130 is one of the main ways of mass transfer of micro light-emitting diodes, in the manufacturing method of the display panel 100 of this embodiment, the connecting layer 120 is essentially a transfer unit in the transfer process. In other words, in this embodiment, conditions for forming the shape of the light-shielding layer are provided by the transfer unit in the originally existing process. Further, after the molding structure 140 is formed, since removal of the connecting layer 120 is also necessary in the transfer process, the accommodating portion C1 is also naturally formed during the process of removal. Accordingly, since the manufacturing method of the display panel 100 of this embodiment is realized further on the basis of the existing mass transfer process, it is not required to add a large number of complicated manufacturing processes, significantly reducing the manufacturing costs of the light-shielding layer.

Other embodiments will be provided below to serve for description. It should be noted here that, the reference numerals and part of the contents of the above embodiments remain to be used in the following embodiments, where the same reference numerals are used to refer to the same or similar elements, and the description of the same technical content is omitted. Reference may be made to the above embodiments for the description of the omitted part, which will not be repeated in the following embodiments.

Figure 2A:
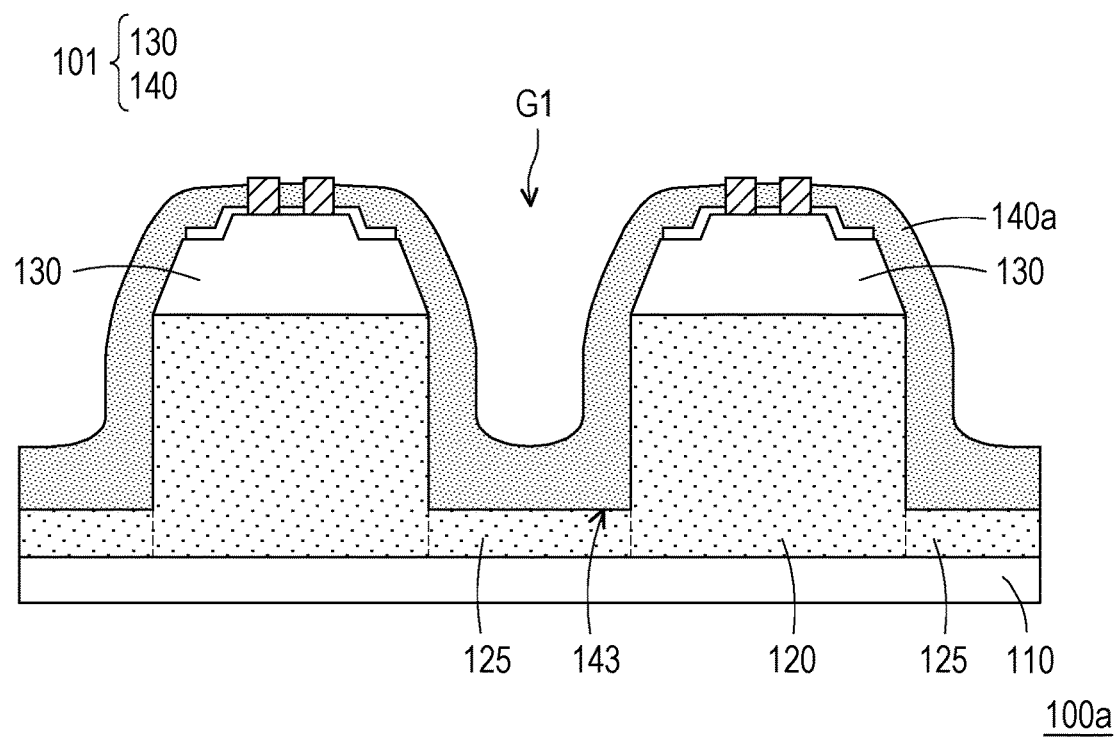
FIG. 2A is a schematic cross-sectional view of a manufacturing method of a display panel according to another embodiment of the disclosure.
Figure 2B:
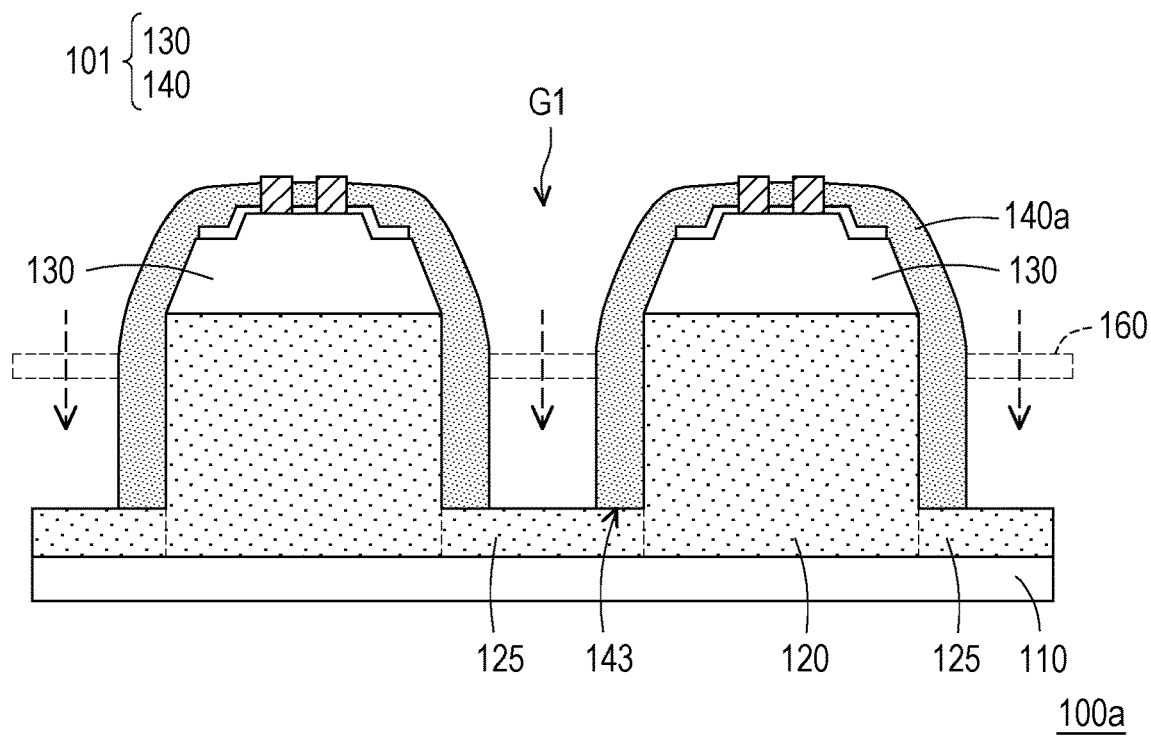
FIG. 2B is a schematic cross-sectional view of a manufacturing method of a display panel according to another embodiment of the disclosure.

FIG. 2A is a schematic cross-sectional view of a manufacturing method of a display panel according to another embodiment of the disclosure. FIG. 2B is a schematic cross-sectional view of a manufacturing method of a display panel according to another embodiment of the disclosure. With reference to FIG. 1A to FIG. 1F and FIG. 2A and FIG. 2B together, a display panel 100a of this embodiment is similar to the display panel 100 in FIG. 1A to FIG. 1F, and the main differences are that a manufacturing method of the display panel 100a of this embodiment also includes the following. The connecting layers 120 are connected to each other to form a protection layer 125 on the carrier substrate 110, and patterning is performed to remove a part of a molding structure 140a according to an exposure pattern 160.

Specifically, with reference to FIG. 1A and FIG. 2A together, in this embodiment, at the time when the connecting layers 120 of FIG. 1A are formed on the carrier substrate 110, the protection layer 125 may be formed on the carrier substrate 110 and between the connecting layers 120 to connect the connecting layers 120 to each other through the protection layer 125, and the protection layer 125 may be located between the molding structure 140a and the carrier substrate 110. Next, when the molding structure 140a is subsequently formed, the molding structure 140a may cover the protection layer 125. Accordingly, when the connecting layer 120 and the carrier substrate 110 are subsequently separated by a laser lift-off process, the protection layer 125 may serve to protect the end portion 143 of the molding structure 140a, facilitating control of the depth (i.e., the distance D1) of the subsequently formed accommodating portion C1. In some embodiments, the protection layer 125 may be integrally formed with the connecting layer 120.

Next, with reference to FIG. 2B together, after the connecting layers 120 and the protection layer 125 are formed on the carrier substrate 110, and then the molding structure 140a is formed to cover on the micro light-emitting chip 130, the connecting layer 120, and the protection layer 125, the part of the molding structure 140a required to be removed is defined by the exposure pattern 160. An orthogonal projection of the exposure pattern 160 on the carrier substrate 110 is not overlapped with the orthogonal projections of the micro light-emitting diode structures 101 on the carrier substrate 110.

As shown in FIG. 2B, patterning is performed to remove a part of the molding structure 140a according to the exposure pattern 160, and the removed part corresponds to the gap G1 between the micro light-emitting chips 130. The gap G1 may expose the protection layer 125 below. Alternatively, since it is not necessary to retain the protection layer 125 in the subsequent transfer process, in the patterning here, part or all of the protection layer 125 below the molding structure 140a may be removed (not shown in the figures).

Figure 3:
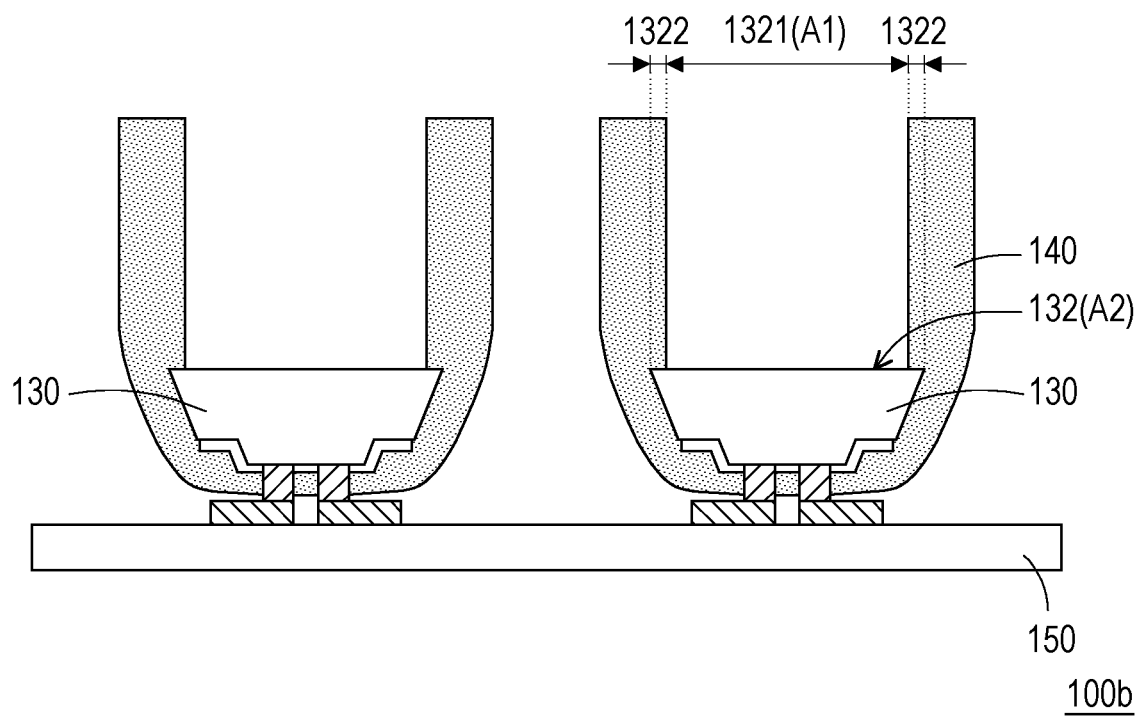
FIG. 3 is a schematic cross-sectional view of a display panel according to another embodiment of the disclosure.

FIG. 3 is a schematic cross-sectional view of a display panel according to another embodiment of the disclosure. With reference to FIG. 1F and FIG. 3 together, a display panel 100b of this embodiment is similar to the display panel 100 in FIG. 1F, but the main differences between them are that, in the display panel 100b of this embodiment, the second surface 132 of each micro light-emitting chip 130 may be divided into a central part 1321 and a peripheral part 1322.

Specifically, with reference to FIG. 3 in conjunction with FIG. 2A, during the process of manufacturing the display panel 100b of this embodiment, since the width (or area) of the upper surface of the connecting layer (not shown) is smaller than the width (or area) of the second surface 132 of the micro light-emitting chip 130, when the second surface 132 of the micro light-emitting chip 130 is bonded to the connecting layer, the central part 1321 of the second surface 132 covers the connecting layer, and the peripheral part 1322 of the second surface 132 is exposed.

Next, during the process of forming the molding structure 140, since the molding structure 140 may be in contact with and cover the peripheral part 1322 exposed by the connecting layer, after the connecting layer is removed, the central part 1321 of the second surface 132 may be exposed by the molding structure 140, and the peripheral part 1322 may still be covered by the molding structure 140. A ratio of an area A1 of the central part 1321 to an area A2 of the second surface 132 may be, for example but not limited to, greater than or equal to 0.7 and less than 1 (i.e., $0.7 \leq A1/A2 < 1$).

In other words, for the second surface 132 of the micro light-emitting chip 130, the width (or area) of the central part 1321 of may be substantially equal to the width (or area) of the upper surface of the connecting layer, and the width (or area) of the central part 1321 may be controlled by the width (or area) of the upper surface of the connecting layer.

In this embodiment, since the peripheral part 1322 of the second surface 132 of the micro light-emitting chip 130 may be covered by the molding structure 140, and the central part 1321 may be exposed by the molding structure 140, thereby the size of the light-emitting region (i.e., the central part 1321) is controlled to concentrate the emitted light of the micro light-emitting chip 130.

FIG. 4A to FIG. 4B are schematic cross-sectional views of a manufacturing method of a display panel according to another embodiment of the disclosure. With reference to FIG. 1A to FIG. 1F and FIG. 4A and FIG. 4B together, a display panel 100c of this embodiment is similar to the display panel 100 in FIG. 1A to FIG. 1F, but the main differences between them are that, in a manufacturing method of the display panel 100c of this embodiment, a connecting layer 120b is substantially in a shape of a square frustum, and the second surface 132 also has the central part 1321 which is exposed and the peripheral part 1322 which is covered by a molding structure 140b. Specifically, with reference to FIG. 4A first, in this embodiment, in forming the connecting layers 120b on the carrier substrate 110, a cross-sectional area of the connecting layers 120b gradually decreases in a direction away from the carrier substrate 110.

Next, in a way similar to FIG. 1B and FIG. 1C, the micro light-emitting chips 130 are provided, the connecting layers 120b are bonded to the second surfaces 132 of the corresponding micro light-emitting chips 130, the molding structure 140b is formed on the micro light-emitting chips 130, a part of the molding structure 140b on the first surface 131 is removed, the circuit substrate 150 is provided, and the micro light-emitting chips 130 are bonded to the circuit substrate 150.

Then, with reference to FIG. 4B, the connecting layers 120b may be removed to separate the micro light-emitting chips 130 from the carrier substrate 110 and expose the second surface 132 of each micro light-emitting chip 130 and the inner side wall 141 of the molding structure 140b. There is an included angle θ between the inner side wall 141 and the second surface 132, and the included angle θ is, for example but not limited to, between 90 degrees and 150 degrees. In addition, in this embodiment, since a cross-sectional area of a accommodating portion C2 may gradually increase from the second surface 132 toward the end portion 143, the accommodating portion C2 may provide a larger space for more color conversion materials and/or micro lenses to be filled therein in the subsequent manufacturing process.

In addition, in other embodiments, the connecting layer 120b may also have a different shape. For example, the accommodating portion C1 of FIG. 1F is formed by the connecting layer 120 in a shape of a rectangular cuboid. Nonetheless, the disclosure is not limited thereto. Depending on the requirements of different shapes of light, the connecting layer 120b may also have other shapes (for example but not limited to a shape of a truncated cone), to accordingly change the light-emitting area or shape of the central part 1321 of the second surface 132.

By utilizing the connecting layer 120b and the molding structure 140, in this embodiment, the light-emitting angle and region of the micro light-emitting chip 130 may be controlled to achieve the function of a light-shielding layer. In addition, compared to an existing light-shielding layer structure which is only disposed on the light-emitting side of the micro light-emitting diode, the molding structure 140 of this embodiment further extends on the peripheral surface 133 and the first surface 131 of the micro light-emitting chip 130. Accordingly, in conjunction with the inner side wall 141 of the molding structure 140, it is possible to ensure that the light emitted by the micro light-emitting chip 130 is emitted only from the upper side (i.e., the second surface 132), thus preventing lateral light leakage while achieving better light concentration.

Figure 5:
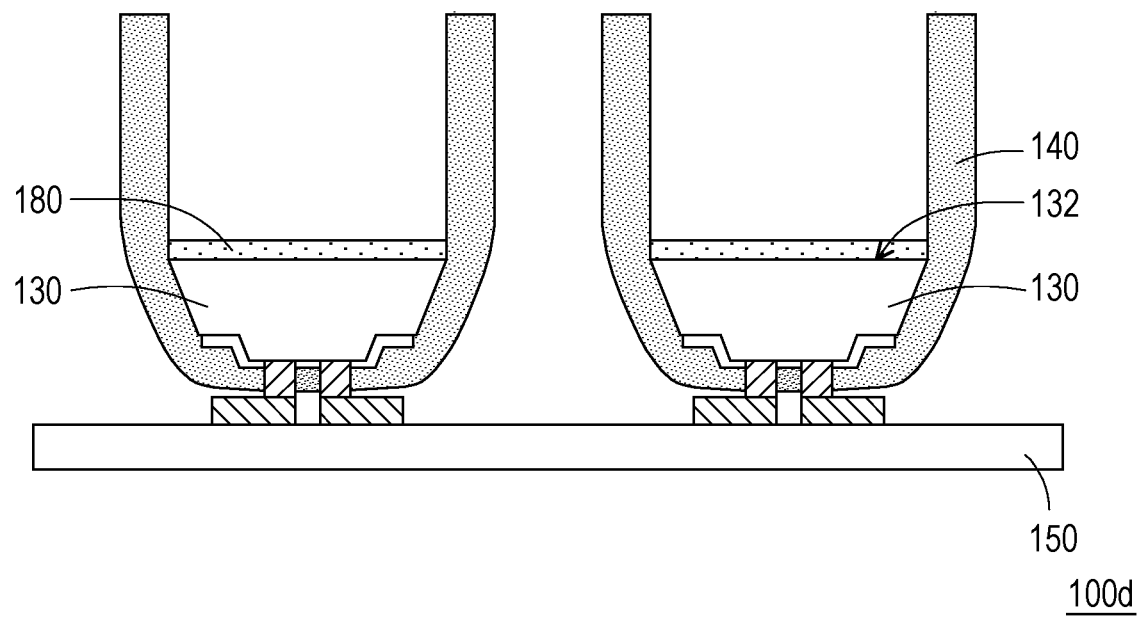
FIG. 5 is a schematic cross-sectional view of a display panel according to another embodiment of the disclosure.

FIG. 5 is a schematic cross-sectional view of a display panel according to another embodiment of the disclosure. With reference to FIG. 1F and FIG. 5 together, a display panel 100d of this embodiment is similar to the display panel 100 in FIG. 1F, but the main differences between them are that, in the display panel 100d of this embodiment, each micro light-emitting chip 130 further includes a light guide layer 180.

Specifically, with reference to FIG. 5, in this embodiment, the light guide layer 180 is disposed on the second surface 132 of each micro light-emitting chip 130. The light guide layer 180 may be, for example, a part of the connecting layer (not shown). To be specific, in a manufacturing method of the display panel 100d of this embodiment, when the connecting layer is removed, it is possible to not completely remove the connecting layer and retain a part of the connecting layer on the second surface 132, so that the part of the connecting layer serves as the light guide layer 180.

In summary of the foregoing, in the display panel and the manufacturing method thereof according to the embodiments of the disclosure, since the molding structure may extend on the peripheral surface and the first surface of the micro light-emitting chip, crosstalk between lights emitted by two adjacent micro light-emitting chips can be prevented, and light directivity can be improved. Next, since the molding structure does not cover the exposed region of the circuit substrate and can expose the exposed region of the circuit substrate, the light transmittance (or transparency) of the display panel of the embodiments of the disclosure can be improved. Furthermore, compared to general steps of manufacturing in which a relatively thick molding structure cannot be manufactured because of limitations of a photolithography process, in the manufacturing method of a display panel of the embodiments of the disclosure, a relatively thick molding structure can be easily adjusted or manufactured as required by changing the height of the connecting layer, so that the accommodating portion of the molding structure has better applicability (for example but not limited to filling quantum dot materials and/or refractive elements therein). In addition, since the forming the molding structure may be performed on the carrier substrate (temporary substrate), it is not required to perform complicated and relatively difficult processes such as high temperature and circuit protection processes on the circuit substrate in the subsequent manufacturing process, thus greatly improving the product yield.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A display panel, comprising:
a circuit substrate; and
a plurality of micro light-emitting diode structures, each comprising:
a micro light-emitting chip, electrically bonded to the circuit substrate and comprising:
a first surface, located on a side of the micro light-emitting chip facing the circuit substrate;
a second surface, disposed opposite to the first surface; and
a peripheral surface, connecting the first surface and the second surface; and a molding structure, surrounding the peripheral surface and enclosing the second surface of the micro light-emitting chip, wherein the molding structure extends in a direction away from the circuit substrate and forms an inner side wall, and the inner side wall and the second surface constitute an accommodating portion, wherein a depth of the accommodating portion is between 3 micrometers and 10 micrometers.

2. The display panel according to claim 1, wherein the molding structure extends from the peripheral surface to the first surface of the micro light-emitting chip.

3. The display panel according to claim 2, wherein each of the micro light-emitting chips further comprises at least one electrode, disposed on the first surface and exposed from the molding structure, and being electrically connected to the circuit substrate.

4. The display panel according to claim 2, wherein there is a gap between each of the molding structures and the circuit substrate.

5. The display panel according to claim 1, wherein the second surface of each of the micro light-emitting chips is divided into a central part and a peripheral part, the peripheral part is covered by the molding structure, and a ratio of an area of the central part to an area of the second surface is greater than or equal to 0.7.

6. The display panel according to claim 1, wherein there is an included angle between the inner side wall and the second surface, and the included angle is between 90 degrees and 150 degrees.

7. The display panel according to claim 1, wherein the molding structure has an end portion, and a cross-sectional area of the accommodating portion gradually increases from the second surface toward the end portion.

8. The display panel according to claim 1, wherein the circuit substrate has an exposed region, located between orthogonal projections of any adjacent two of the micro light-emitting diode structures on the circuit substrate, and the exposed region is not overlapped with orthogonal projections of the molding structures on the circuit substrate.

9. The display panel according to claim 1, wherein the molding structure comprises a non-transparent material.

10. The display panel according to claim 1, wherein each of the micro light-emitting diode structures further comprises:

a light guide layer, disposed on the second surface.

11. The display panel according to claim 1, wherein the accommodating portion is an air accommodating portion.

12. The display panel according to claim 1, wherein the depth of the accommodating portion is greater than a distance between the second surface and the first surface.

* * * * *